United States Patent
Suzuki et al.

(10) Patent No.: US 10,559,707 B2
(45) Date of Patent: Feb. 11, 2020

(54) PHOTODETECTOR AND LIDAR DEVICE USING THE SAME

(71) Applicant: KABUSHIKI KAISHA TOSHIBA, Minato-ku (JP)

(72) Inventors: Kazuhiro Suzuki, Minato (JP); Risako Ueno, Meguro (JP); Hiroto Honda, Yokohama (JP); Koichi Ishii, Kawasaki (JP); Toshiya Yonehara, Kawasaki (JP); Hideyuki Funaki, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 546 days.

(21) Appl. No.: 15/384,938

(22) Filed: Dec. 20, 2016

(65) Prior Publication Data

US 2017/0263798 A1 Sep. 14, 2017

(30) Foreign Application Priority Data

Mar. 10, 2016 (JP) .................................. 2016-047460

(51) Int. Cl.

| G01S 17/00 | (2006.01) |
|---|---|
| H01L 31/107 | (2006.01) |
| G01S 17/08 | (2006.01) |
| G01S 17/89 | (2006.01) |
| H01L 31/02 | (2006.01) |
| H01L 31/028 | (2006.01) |
| H01L 31/18 | (2006.01) |

(52) U.S. Cl.
CPC .......... *H01L 31/1075* (2013.01); *G01S 17/08* (2013.01); *G01S 17/89* (2013.01); *H01L 31/02027* (2013.01); *H01L 31/0284* (2013.01); *H01L 31/1804* (2013.01); *H01L 31/1864* (2013.01)

(58) Field of Classification Search
USPC ............................................... 356/5.01, 4.01
See application file for complete search history.

(56) References Cited

U.S. PATENT DOCUMENTS

| 4,083,062 A * | 4/1978 | Ohuchi | H01L 31/107 257/438 |
| 4,731,641 A * | 3/1988 | Matsushima | H01L 31/18 257/189 |
| 5,453,611 A * | 9/1995 | Oozu | H01L 27/14621 250/208.1 |
| 8,357,960 B1 * | 1/2013 | Dutta | H01L 31/035218 257/186 |

(Continued)

FOREIGN PATENT DOCUMENTS

| JP | 2000-349329 A | 12/2000 |
| JP | 2008-153311 A | 7/2008 |

(Continued)

*Primary Examiner* — James R Hulka
(74) *Attorney, Agent, or Firm* — Oblon, McClelland, Maier & Neustadt, L.L.P.

(57) ABSTRACT

A photodetector according to an embodiment includes: a first semiconductor layer; a porous semiconductor layer disposed on the first semiconductor layer; and at least one photo-sensing element including a second semiconductor layer of a first conductivity type disposed in a region of the porous semiconductor layer and a third semiconductor layer of a second conductivity type disposed on the second semiconductor layer.

15 Claims, 7 Drawing Sheets

(56) References Cited

U.S. PATENT DOCUMENTS

| | | | |
|---|---|---|---|
| 8,629,485 B2 | 1/2014 | Yamamura et al. | |
| 9,106,858 B2* | 8/2015 | Jin | H04N 5/3745 |
| 9,178,100 B2* | 11/2015 | Webster | H01L 27/1443 |
| 9,691,932 B2* | 6/2017 | Sasaki | H01L 31/103 |
| 2004/0178463 A1* | 9/2004 | Merrill | H01L 27/14603 |
| | | | 257/440 |
| 2011/0266644 A1* | 11/2011 | Yamamura | H01L 27/1462 |
| | | | 257/431 |
| 2012/0248295 A1* | 10/2012 | Ito | H03F 3/08 |
| | | | 250/214.1 |
| 2013/0193546 A1 | 8/2013 | Webster et al. | |
| 2013/0300838 A1* | 11/2013 | Borowski | G01S 7/486 |
| | | | 348/46 |
| 2014/0092287 A1* | 4/2014 | Jin | H04N 5/3745 |
| | | | 348/301 |
| 2016/0079464 A1 | 3/2016 | Sasaki et al. | |
| 2016/0307939 A1* | 10/2016 | Wang | H01L 27/1443 |
| 2017/0031010 A1 | 2/2017 | Suzuki et al. | |

FOREIGN PATENT DOCUMENTS

| | | |
|---|---|---|
| JP | 2010-226071 A | 10/2010 |
| JP | 2013-65911 A | 4/2013 |
| JP | 2016-62996 A | 4/2016 |
| JP | 2017-33962 A | 2/2017 |

\* cited by examiner

PHOTODETECTOR AND LIDAR DEVICE USING THE SAME

CROSS REFERENCE TO RELATED APPLICATIONS

This application is based upon and claims the benefit of priority from prior Japanese Patent Application No. 2016-047460 filed on Mar. 10, 2016 in Japan, the entire contents of which are incorporated herein by reference.

FIELD

Embodiments described herein relate generally to a photodetector and a LIDAR device using the photodetector.

BACKGROUND

A silicon photomultiplier ("SiPM") is a photo-sensing element in which avalanche photodiodes ("APDs") are two-dimensionally arranged and operated with a reverse-bias voltage that is higher than the breakdown voltage of the APDs in a regime called "Geiger mode." Since the gain of an APD operating in the Geiger mode is very high, $10^5$ to $10^6$, subtle light of a single photon may be measured.

A resistor with a high resistance called "quenching resistor" is connected in series to each APD. When a single photon enters the APD to cause a Geiger discharge, the current amplification is terminated by a voltage drop caused by the quenching resistor. Therefore, a pulse output signal is obtained. Since each APD in a SiPM operates in the manner described above, if the Geiger discharge is caused in two or more APDs, an output signal with a charge value or pulse wave height value that is the charge value or pulse wave height value of a single Geiger-discharge APD times the number of Geiger-discharge APDs is obtained. Therefore, the number of Geiger-discharge APDs, i.e., the number of photons entering the SiPM, can be measured from the output signal. This enables single photon measurement.

As described above, a SiPM operates with a reverse-bias voltage that is higher than the breakdown voltage of APDs. Therefore, the thickness of a depletion layer of each APD is generally 2 μm to 3 μm, and the reverse-bias voltage is generally 100 V or less. Accordingly, the spectral sensitivity characteristic of the SiPM is highly dependent on the absorption characteristic of silicon, and the SiPM has a sensitivity peak in a range from 400 nm to 600 nm, but is substantially not sensitive to near infrared light in a wavelength band of 800 nm or more.

Compound semiconductor devices, for example, are known as photo-sensing elements having a high sensitivity in near infrared light wavelength band. However, the photo-sensing elements of this kind are still expensive, and complicated to manufacture. Silicon-based photo-sensing elements in which the depletion layer has a thickness as thick as several micrometers to become sensitive to light in near-infrared wavelength band are also known. However, the drive voltage for driving the photo-sensing elements of this kind is as high as several volts, and the APD array in these photo-sensing elements is not minute like that of SiPMs.

Photo-sensing elements of another kind are also known, in which a silicon substrate has a scattering surface on the back side with irregularities made by laser processing to reflect unabsorbed light. However, it is difficult to control the preciseness of the irregularities of the scattering surface to appropriately reflect light in the near-infrared wavelength band. Furthermore, a dedicated laser processing machine and a special process are needed, which may lead to an increase in costs. Mechanically processing a silicon layer included in a diode leads to forming a defective layer, and may cause problems in the electric characteristics of the photodetectors such as stability, yield, and reproducibility. Moreover, in consideration of the extinction coefficient of silicon in the near-infrared wavelength region, the photo-sensing element itself needs to be thinned to about 10 μm. This also increases the number of additional steps and the manufacturing costs.

DETAILED DESCRIPTION

A photodetector according to an embodiment includes: a first semiconductor layer; a porous semiconductor layer disposed on the first semiconductor layer; and at least one photo-sensing element including a second semiconductor layer of a first conductivity type disposed in a region of the porous semiconductor layer and a third semiconductor layer of a second conductivity type disposed on the second semiconductor layer.

Embodiments will now be described with reference to the accompanying drawings.

First Embodiment

Figure 1:
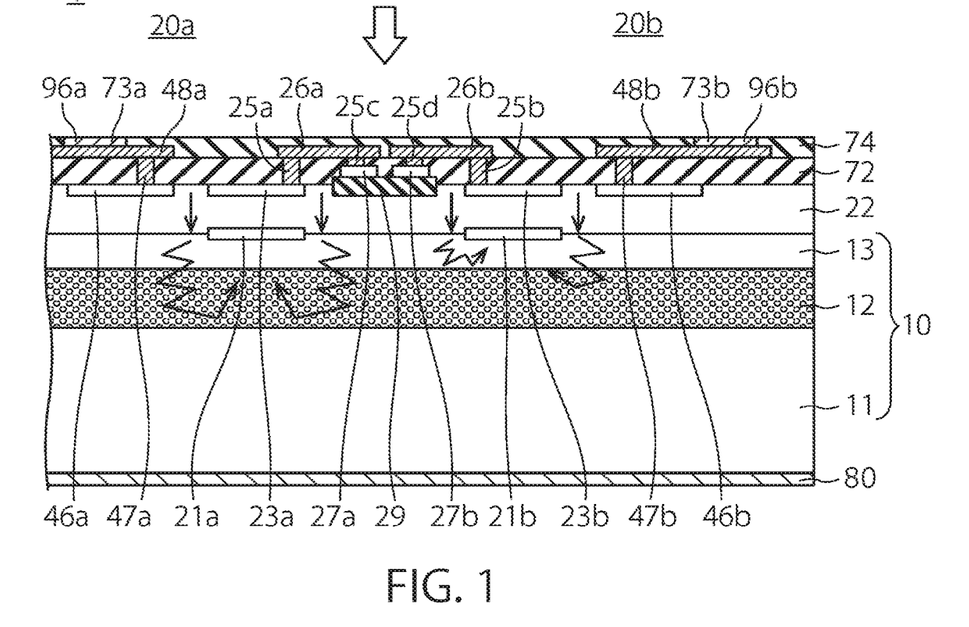
FIG. 1 is a cross-sectional view of a photodetector according to a first embodiment.

FIG. 1 shows a cross-sectional view of a photodetector according to a first embodiment. The photodetector 1 according to the first embodiment includes a plurality of (two in FIG. 1) photo-sensing elements 20a and 20b that detect light and convert the light to an electrical signal. The photodetector 1 also includes a periphery circuit with a transistor for processing the electrical signal converted by the photo-sensing elements 20a and 20b, although the periphery circuit is not shown in FIG. 1.

The photo-sensing elements 20a and 20b are disposed on a substrate 10 having a multilayer structure. The substrate 10 includes a p-type silicon substrate 11 of crystalline silicon, a porous silicon layer 12 disposed on the silicon substrate 11, and an $n^+$-type semiconductor layer 13 disposed on the porous silicon layer 12.

The photo-sensing element 20a includes a part of the $n^+$-type semiconductor layer 13, a $p^+$-type semiconductor layer 21a disposed on the part of the $n^+$-type semiconductor layer 13, a part of a $p^-$-type semiconductor layer 22 covering the $p^+$-type semiconductor layer 21a, a $p^+$-type semiconductor layer 23a disposed on the part of the $p^-$-type semiconductor layer 22, a contact 25a disposed on the $p^+$-type semiconductor layer 23a, a wiring line 26a connecting to the contact 25a, and a quenching resistor 27a connecting to the wiring line 26a. An impurity region (conductor region) 46a is disposed on the part of the $p^-$-type semiconductor layer 22 where the photo-sensing element 20a is disposed. The impurity region 46a connects to a wiring line 48a.

The photo-sensing element 20b includes a part of the $n^+$-type semiconductor layer 13, a $p^+$-type semiconductor layer 21b disposed on the part of the $n^+$-type semiconductor layer 13, a part of the $p^-$-type semiconductor layer 22 covering the $p^+$-type semiconductor layer 21b, a $p^+$-type semiconductor layer 23b disposed on the part of the $p^-$-type semiconductor layer 22, a contact 25b disposed on the $p^+$-type semiconductor layer 23b, a wiring line 26b connecting to the contact 25b, and a quenching resistor 27b connecting to the wiring line 26b. An impurity region (conductor region) 46b is disposed on the part of the $p^-$-type semiconductor layer 22 where the photo-sensing element 20b is disposed. The impurity region 46b connects to a wiring line 48b. The $p^+$-type semiconductor layers 21a and 21b and the $p^+$-type semiconductor layers 23a and 23b have a higher impurity concentration than the $p^-$-type semiconductor layer 22.

On the opposite side of the substrate 10 to the photo-sensing elements 20a and 20b, a back electrode 80 is disposed to serve as a cathode for each of the photo-sensing elements 20a and 20b. Light enters the photodetector 1 from the side where the photo-sensing elements 20a and 20b are disposed. The photo-sensing elements 20a and 20b are vertical photodiodes.

The quenching resistors 27a and 27b are covered by an interlayer insulating layer 72, on which the wiring lines 26a and 26b are disposed. A first end of the wiring line 26a connects to the $p^+$-type semiconductor layer 23a via the contact 25a formed through the interlayer insulating layer 72, and a second end connects to the quenching resistor 27a via a contact 25c formed through the interlayer insulating layer 72. A first end of the wiring line 26b connects to the $p^+$-type semiconductor layer 23b via the contact 25b formed through the interlayer insulating layer 72, and a second end connects to the quenching resistor 27b via a contact 25d formed through the interlayer insulating layer 72.

The wiring lines 48a and 48b connecting to the periphery circuit are disposed on the interlayer insulating layer 72. The wiring line 48a connects to the impurity region 46a via a contact 47a formed through the interlayer insulating layer 72, and the wiring line 48b connects to the impurity region 46b via a contact 47b formed through the interlayer insulating layer 72. The wiring lines 26a, 26b, 48a, and 48b are covered by an interlayer insulating layer 74. The interlayer insulating layer 74 has an opening 73a connecting to the wiring line 48a and an opening 73b connecting to the wiring line 48b. A pad 96a is disposed on a portion of the wiring line 48a corresponding to the bottom of the opening 73a, and a pad 96b is disposed on a portion of the wiring line 48b corresponding to the bottom of the opening 73b. The pad 96a is connected to an anode of the photo-sensing element 20a or an I/O terminal of the periphery circuit, and the pad 96b is connected to an anode of the photo-sensing element 20b or an I/O terminal of the periphery circuit.

Figure 2:
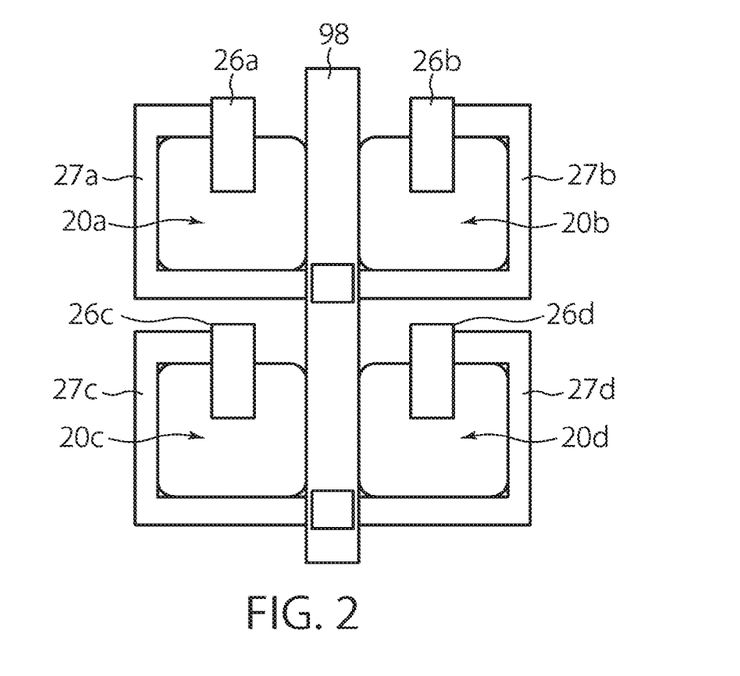
FIG. 2 is a plan view of the photodetector according to the first embodiment.

The photodetector 1 having the aforementioned structure includes a plurality of photo-sensing elements. The photo-sensing elements are generally arranged in an array form as shown in FIG. 2. FIG. 2 shows a schematic top view of photo-sensing elements 20a, 20b, 20c, and 20d arranged in a 2×2 array form. As can be understood from FIG. 2, a quenching resistor 27a is disposed to surround a part of the photo-sensing element 20a, a quenching resistor 27b is disposed to surround a part of the photo-sensing element 20b, a quenching resistor 27c is disposed to surround a part of the photo-sensing element 20c, and a quenching resistor 27d is disposed to surround a part of the photo-sensing element 20d. A terminal of the photo-sensing element 20a is connected to a first end of the quenching resistor 27a via the wiring line 26a, a terminal of the photo-sensing element 20b is connected to a first end of the quenching resistor 27b via the wiring line 26b, a terminal of the photo-sensing element 20c is connected to a first end of the quenching resistor 27c via the wiring line 26c, and a terminal of the photo-sensing element 20d is connected to a first end of the quenching resistor 27d via the wiring line 26d. As shown in FIG. 2, a wiring line 98 is disposed between the photo-sensing elements 20a and 20b that are adjacent to each other in the row direction (horizontal direction in FIG. 2) and between the photo-sensing elements 20c and 20d that are adjacent to each other in the row direction. Second ends of the quenching resistors 26a, 26b, 26c, and 26d are connected to the wiring line 98. Thus, the photo-sensing elements 20a, 20b, 20c, and 20d arranged in the array are connected in parallel in this embodiment.

The photodetector 1 having this structure is a silicon photomultiplier ("SiPM"), and each of the photo-sensing elements 20a, 20b, 20c, and 20d in the photodetector 1 having this structure is an avalanche photodiode ("APD") in this embodiment.

The operation of the photodetector 1 according to the first embodiment will be described with reference to FIG. 1. A reverse-bias voltage is applied to each of the photo-sensing elements 20a and 20b. The reverse-bias voltage is applied between each of the pads 96a and 96b shown in FIG. 1 and the wiring line 98 shown in FIG. 2. A potential applied to the electrode 80 is also applied to the n-type semiconductor layer 13 via the silicon substrate 11 and the porous silicon layer 12, and a potential applied to the wiring line 98 is also applied to the $p^+$-type semiconductor layers 23a and 23b via the quenching resistors 27a and 27b, the contacts 25c and 25d, the wiring lines 26a and 26b, and the contacts 25a and 25b.

A pair of electron and hole ("electron-hole pair") is produced from the light incident to the photodetector 1 in a depletion layer near the interface between the part of the n-type semiconductor layer 13 and the $p^+$-type semiconductor layer 21a in the photo-sensing element 20a and a depletion layer near the interface between the part of the n-type semiconductor layer 13 and the $p^+$-type semiconductor layer 21b in the photo-sensing element 20b. Since the reverse-bias voltage is being applied, the produced electrons flow to the n-type semiconductor layer 13, and the produced holes flow to the $p^+$-type semiconductor layers 23a and 23b. Some of the produced electrons and holes collide with other atoms in the $p^-$-type semiconductor layer 22 and the $p^+$-type semiconductor layers 23a and 23b and produce new electron-hole pairs. The newly produced electrons and holes further collide with other atoms and produce new electron-hole pairs. Such a chain reaction continues to cause avalanche multiplication by which a photocurrent caused by the incident light is multiplied. The multiplied photocurrent is detected by a readout circuit (not shown) via the quenching resistors 27a and 27b and the wiring line 98. Thus, the $p^+$-type semiconductor layers 23a and 23b function as avalanche layers.

The periphery circuits including analog front end circuits having the readout circuit for processing signals from the photo-sensing elements and active quenching circuits that allow Geiger discharge to actively stop are formed in a periphery region.

Since the porous silicon layer 12 is present below the n-type semiconductor layer 13 in the first embodiment, scattered or diffused light having an arbitrary wavelength, which is not absorbed by a depletion layer having a limited thickness, may be sent back to the depletion layer due to the light confinement effect of the porous silicon layer 12. This substantially elongates the effective optical path length, thereby improving the light absorption efficiency. In the first embodiment, the porous silicon layer 12 causing the light confinement effect may be formed in the substrate before the manufacture of the SiPM in which the photo-sensing elements are connected in parallel. Therefore, there is no need of a complicated final step such as thinning the substrate. This contributes to reduction in the manufacturing costs and improving the yield.

The base material of the porous silicon layer 12 and the hole have a difference in refractive index. The main constituent of the base material is silicon, and the hole is filled with a material having a lower refractive index than the base material. Alternatively, the hole just contains air. The diameter of each hole formed in the porous silicon layer 12 is preferably 10 nm (0.01 µm) to 1000 nm (1 µm) in the first embodiment.

(Manufacturing Method)

A method of manufacturing the photodetector according to the first embodiment will be described with reference to FIGS. 3A to 4B.

Figure 3A:
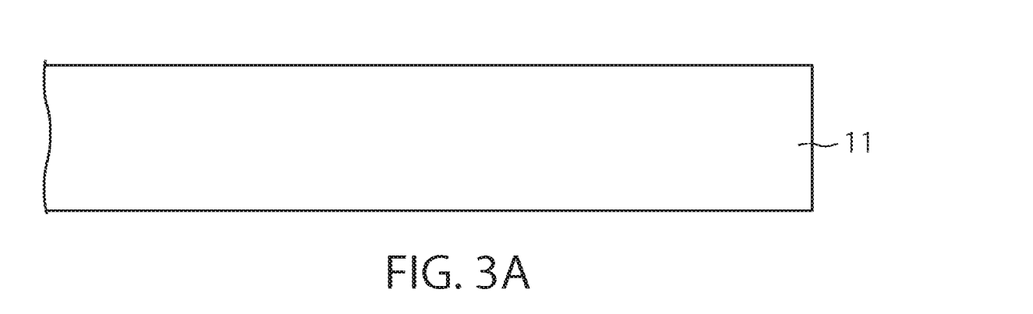
FIGS. 3A to 3C are cross-sectional views showing a process of manufacturing the photodetector according to the first embodiment.
Figure 3B:
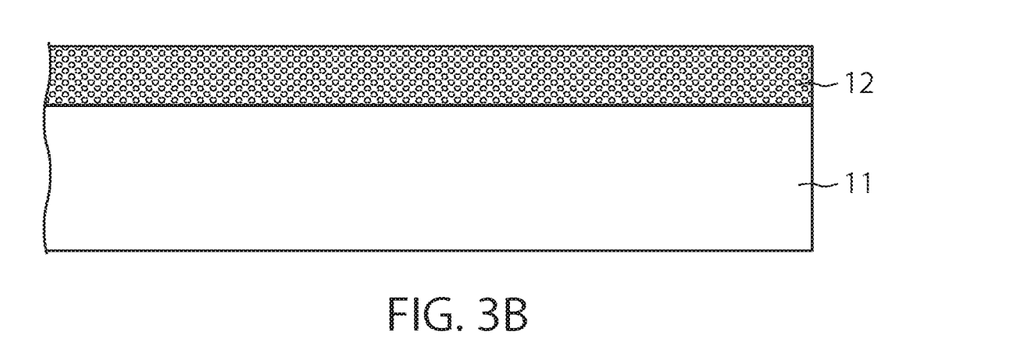
Figure 3C:
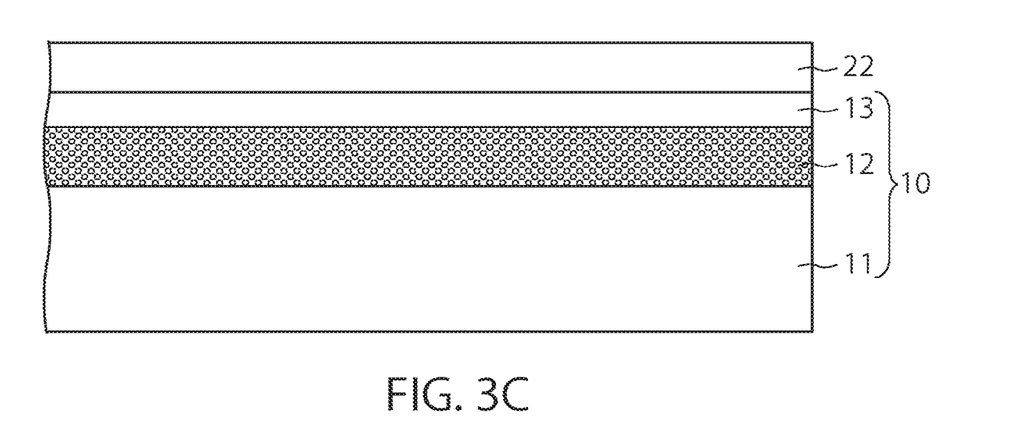

First, a silicon substrate 11 is prepared as shown in FIG. 3A. A porous silicon layer 12 is formed on the silicon substrate 11 by anodization (FIG. 3B). It is known that the growth rate of the porous silicon layer 12 depends on the resistivity of the base material of the silicon substrate 11. For example, assume that the silicon substrate 11 is a boron-doped p-type silicon substrate having a resistivity of 0.01 Ωcm or less on the (100) surface. With a current density of about 150 mA/cm², a porous layer may be grown at a rate of 5 µm or more per minute. In view of the extinction coefficient in the near-infrared wavelength region, the thickness of the porous silicon layer 12 generally required in the photodetector 1 according to the first embodiment is considered to be 10 µm or less. It is considered from this growth rate that the porous silicon layer 12 having a desired depth may be formed by several-minute anodization. As described above, if low-resistance silicon is used as the silicon-based material, the entire substrate may be used as a common electrode. Therefore, a cathode electrode, for example, may be formed easily.

If an APD layer is formed in a crystal silicon layer on a porous silicon layer, crystal defects in the porous silicon layer caused at the interface may lead to the occurrence of a dark current. In order to prevent this, a heat treatment at a temperature of about 1000° C. may be performed under a hydrogen atmosphere on the surface of the porous silicon layer 12 to remove the crystal defects after the porous silicon layer 12 is formed by anodization in the first embodiment. A Si epitaxial layer may be formed on the porous silicon layer 12 from the surface of which the crystal defects are removed.

Figure 4A:
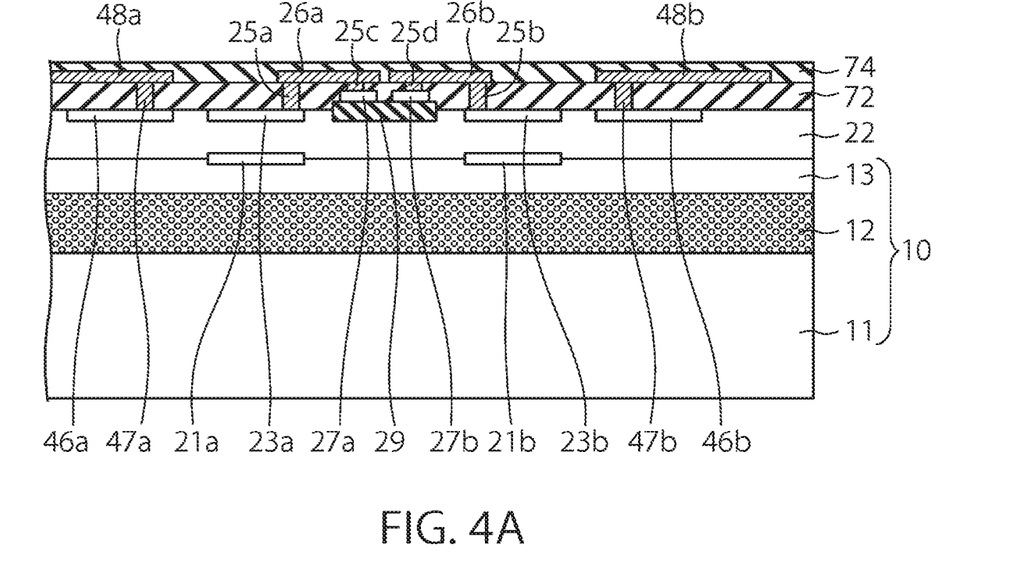
FIGS. 4A and 4B are cross-sectional views showing the process of manufacturing the photodetector according to the first embodiment.

Thereafter, an $n^+$-type semiconductor layer 13 is epitaxially grown on the porous silicon layer 12. As a result, a substrate 10 having a multilayer structure is formed. Subsequently, a $p^-$-type semiconductor layer 22 is formed on the $n^+$-type semiconductor layer 13 by epitaxially growing silicon (FIG. 3C), and an impurity (for example boron) is implanted to some portions of the $p^-$-type semiconductor layer 22 to form $p^+$-type semiconductor layers 21a and 21b (FIG. 4A). As a result, a plurality of light detection regions are formed in the active layer portions of the substrate 10. Device isolation is performed by forming, for example, a "local oxidation of silicon" (LOCOS) structure to prevent interference among the light detection regions.

A first mask that is not shown in FIG. 4A is formed on the $p^-$-type semiconductor layer 22, and a p-type impurity is implanted using the first mask to form $p^+$-type semiconductor layers 23a and 23b and impurity regions 46a and 46b in the $p^-$-type semiconductor layer 22. As a result, light detection regions of the photo-sensing elements 20a and 20b are formed. The first mask is then removed.

Thereafter, quenching resistors 27a and 27b that connect to the photo-sensing elements 20a and 20b in series are formed. The quenching resistor 27a is in contact with a part of the circumference of the photo-sensing element 20a, and the quenching resistor 20b is in contact with a part of the circumference of the photo-sensing element 20b. The quenching resistors 27a and 27b are formed on a device isolation layer 29 as shown in FIG. 4A.

Subsequently, an insulating film 72 covering the quenching resistors 27a and 27b is formed on the $p^-$-type semiconductor layer 22 as shown in FIG. 4A. Openings connecting to the impurity regions 46a and 46b, the $p^+$-type semiconductor layers 23a and 23b, and the quenching resistors 27a and 27b are formed through the insulating film 72 using a lithographic technique. The openings are filled with a conductive material, for example tungsten, to form contacts 47a, 47b, 25a, 25b, 25c, and 25d. Wiring lines 48a, 48b, 26a, and 26b are formed on the insulating film 72 using the lithographic technique. An insulating film 74 is formed to cover the wiring lines 48a, 48b, 26a, and 26b (FIG. 4A).

Figure 4B:
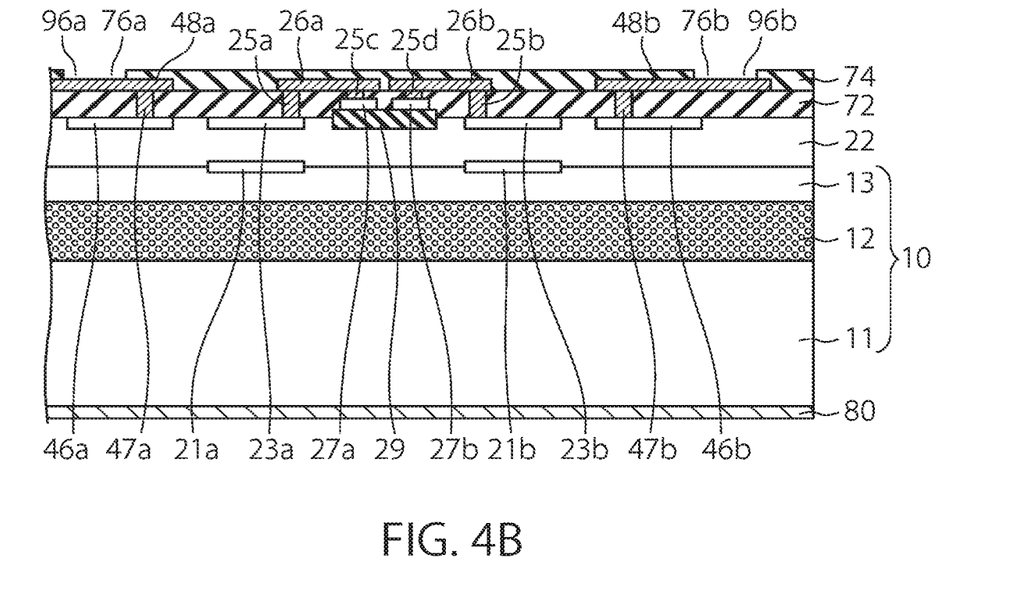

Thereafter, a mask of a photoresist (not shown), for example, is formed on the insulating film 74, as shown in FIG. 4B. The mask has openings that are formed by dry etching, for example, above the wiring lines 48a and 48b. The insulating film 74 is etched with a reaction gas such as $CF_4$ using the mask to form openings 76a and 76b through the insulating film 74. A portion of the wiring line 48a is exposed on the bottom of the opening 76a, and a portion of the wiring line 48b is exposed on the bottom of the opening 76b. The exposed portions become pads 96a and 96b. Subsequently, a metal thin film 80 to become a common cathode electrode is formed on the back side of the silicon substrate 11. The metal thin film 80 is formed of Al, Cu, Ag, or Au, or an alloy containing one or more of these materials. The metal thin film may be a multilayer metal film (FIG. 4B).

As described above, the photodetector 1 according to the first embodiment is manufactured by a semiconductor process on the silicon layer 13 epitaxially grown on the porous silicon layer 12 formed on the single crystal silicon substrate 11 by anodization.

The characteristics of the photodetector 1 according to the first embodiment appearing when the thickness of the porous silicon layer 12 is changed are obtained by simulations. The simulation results will be described with reference to FIGS. 5 to 10.

Figure 5:
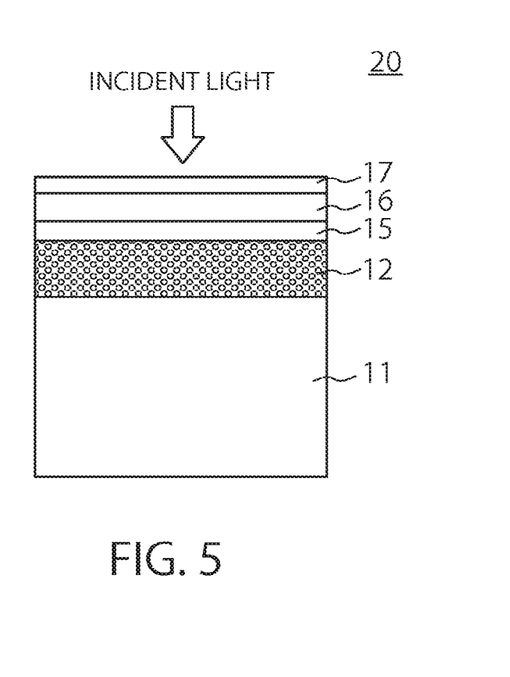
FIG. 5 is a cross-sectional view showing a photo-sensing element including a porous silicon layer, used for simulations.

FIG. 5 shows a cross-sectional view of a photo-sensing element 20 used for the simulations. The photo-sensing element 20 includes a crystalline silicon substrate 11 having a thickness of 700 µm, a porous silicon layer 12 disposed on the crystalline silicon substrate 11, an epitaxially-grown layer 15 corresponding to an n$^+$-type semiconductor layer 13 and a p$^-$-type semiconductor layer 22 having a thickness of 3 µm disposed on the porous silicon layer 12, and a light absorption layer 16. The light absorption layer 16 has a thickness of 2 µm, and the upper surface of the light absorption layer 16 is located at 0.5 µm from the surface of the entire device. The light absorption efficiency of the light absorption layer 16 when arbitrary light enters the photo-sensing element 20 from above is calculated by simulations.

Figure 6:
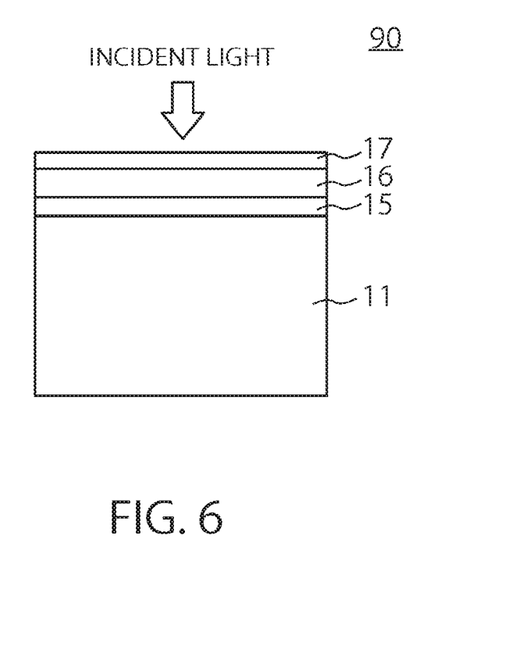
FIG. 6 is a cross-sectional view of a photo-sensing element according to Comparative Example used for the simulations, which does not include a porous silicon layer.

A photodetector 90 shown in FIG. 6, which does not include the porous silicon layer 12 of the photo-sensing element 20 shown in FIG. 5, is used as Comparative Example.

Figure 7:
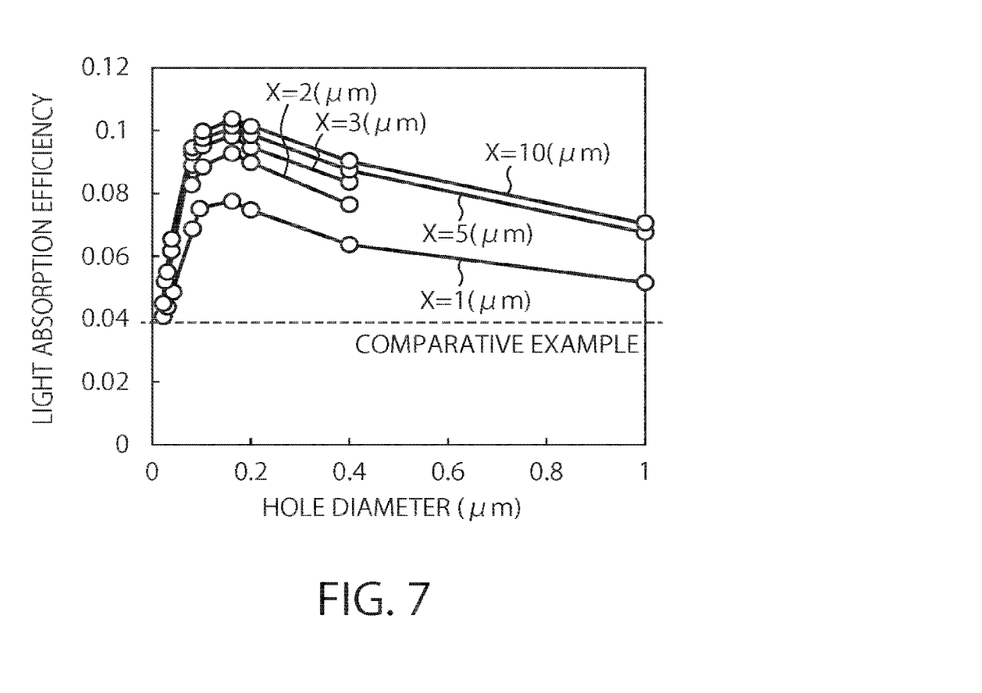
FIG. 7 is a diagram showing the relationship between the light absorption efficiency and the hole diameter.

FIG. 7 shows a simulation result of the relationship between the hole diameter in the porous silicon layer 12 and the absorption efficiency of the photo-sensing element 20 shown in FIG. 5 when the thickness of the porous silicon layer 12 is 1 µm, 2 µm, 3 µm, 5 µm, and 10 µm. In the simulation, the hole filling factor of the porous silicon layer 12 is assumed to be 30%, and the wavelength of the light entering the photo-sensing element 20 is assumed to be 905 nm. FIG. 7 also shows, by a broken line, the light absorption efficiency of the photo-sensing element according to Comparative Example.

As can be understood from FIG. 7, the light absorption efficiency of the photo-sensing element 20 shown in FIG. 5 is higher than that of the photo-sensing element 90 of Comparative Example shown in FIG. 6. Although a greater thickness x of the light absorption layer 16 leads to a greater light absorption efficiency, the light absorption efficiency in the case where the thickness x is 5 µm is close to that in the case where the thickness x is 10 µm. As described above, the porous silicon layer 12 is formed by anodization, and the growth rate depends on the process time. Therefore, the thickness of the porous silicon layer 12 is preferably 10 µm or less. The light absorption efficiency becomes greatest when the diameter of holes in the porous silicon layer 12 is in a range from 0.1 µm to 0.2 µm as can be understood from FIG. 7.

Figure 8:
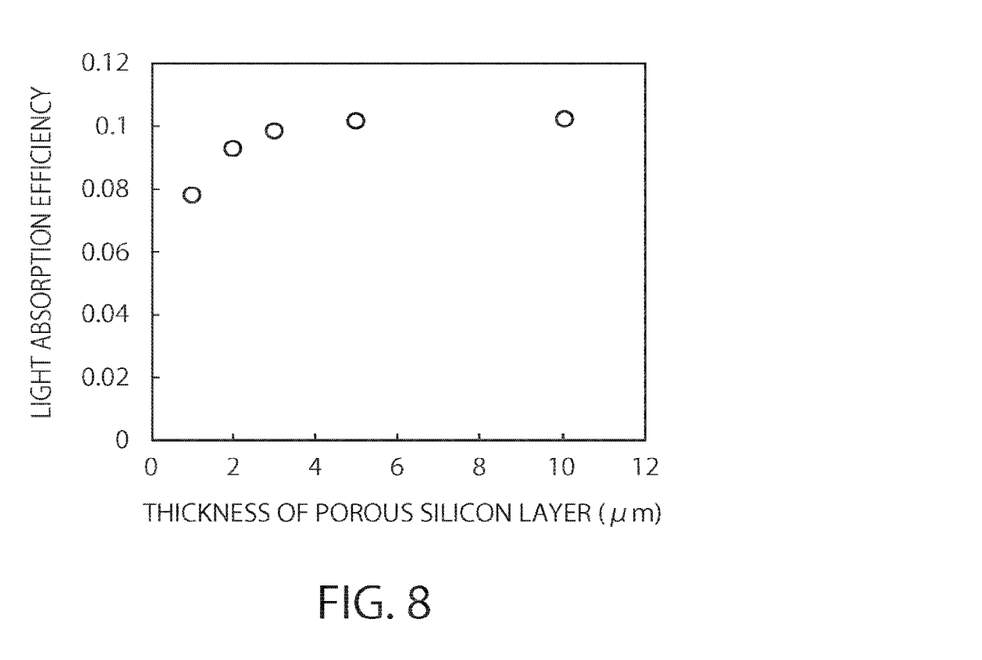
FIG. 8 is a diagram showing the relationship between the light absorption efficiency and the thickness of the porous silicon layer.

FIG. 8 shows the relationship between the absorption efficiency of the photo-sensing element 20 and the thickness of the porous silicon layer 12 when the hole diameter in the porous silicon layer 12 is 0.16 µm. The relationship is obtained based on the simulation result shown in FIG. 7. As described above and illustrated in FIG. 7, the light absorption by the photo-sensing element 20 shown in FIG. 5 including the porous silicon layer 12 with a multiple light reflection structure is better than that of the photo-sensing element 90 according to Comparative Example including no porous silicon layer. FIG. 8 indicates that the light absorption efficiency reaches saturation when the thickness of the porous silicon layer 12 is about 3 µm. In consideration of the upper limit of the thickness of the porous silicon layer 12 and the optical function and the manufacturing efficiency, the thickness is preferably in a range from 3 µm to 10 µm.

Figure 9:
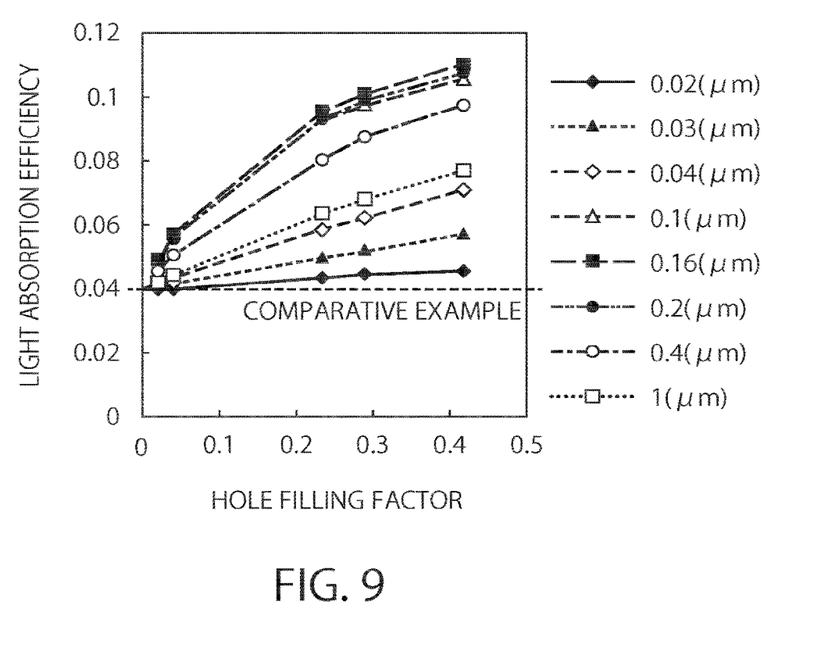
FIG. 9 is a diagram showing the relationship between the light absorption efficiency and the hole filling factor.

FIG. 9 shows the relationship between the hole filling efficiency of the porous silicon layer 12 and the light absorption efficiency for light having a wavelength of 905 nm when the thickness of the porous silicon layer 12 is 5 µm. The relationship is obtained by the above simulation results. The lateral axis in FIG. 9 indicates the hole filling factor. FIG. 9 shows the relationship between the hole filling efficiency and the light absorption efficiency in each of the photo-sensing elements with holes having a diameter of 0.02 µm, 0.03 µm, 0.04 µm, 0.1 µm, 0.16 µm, 0.2 µm, 0.4 µm, and 1 µm. As can be understood from FIG. 9, the light absorption efficiency of all of the photo-sensing elements 20 having the porous silicon layer 12 is better than that of the photo-sensing element according to Comparative Example that does not include a porous silicon layer. The light absorption efficiency considerably improves when the hole diameter is in a range from 0.1 µm to 0.2 µm. If the hole diameter is less than 0.1 µm or more than 0.4 µm, the light absorption efficiency is likely to degrade. Therefore, a great light absorption effect may be obtained if the hole filling factor is 30% or more, and the hole diameter in the porous silicon layer 12 is in a range from 0.1 µm to 0.2 µm.

Figure 10:
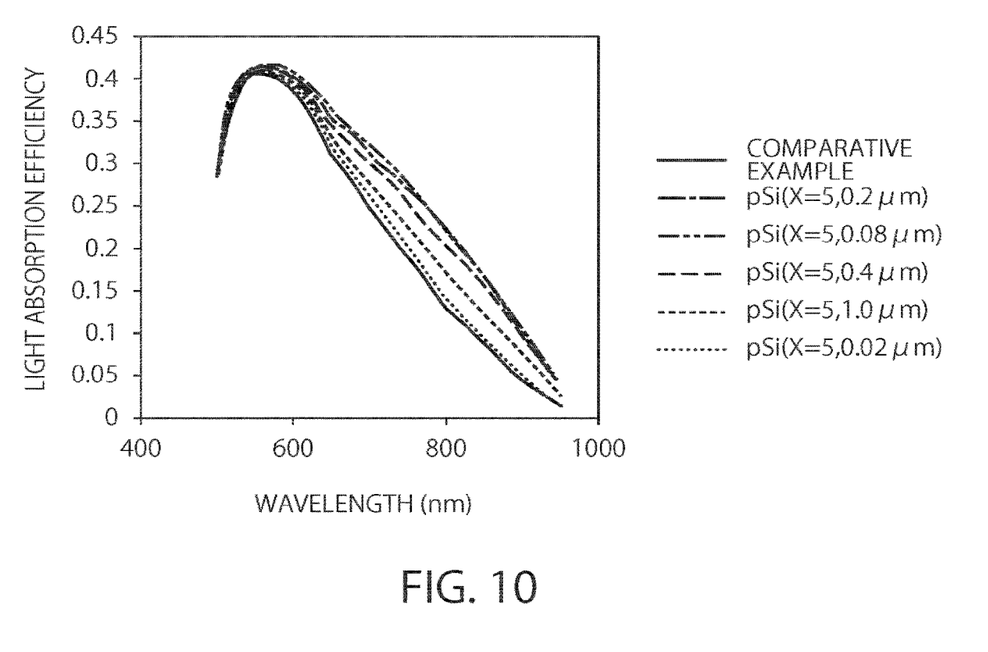
FIG. 10 is a diagram showing the relationship between the light absorption efficiency and the wavelength of incident light.

FIG. 10 shows the relationship between the wavelength of incident light and the light absorption efficiency when the thickness of the porous silicon layer 12 is 5 µm and the hole diameter is 0.02 µm, 0.08 µm, 0.2 µm, 0.4 µm, and 1.0 µm. FIG. 10 also shows the relationship of the photo-sensing element according to Comparative Example. As can be understood from FIG. 10, the light absorption by the photo-sensing element 90 according to Comparative Example has an absorption peak around the wavelength of 550 nm. The greater the wavelength becomes than 550 nm, the lower the light absorption efficiency becomes. LIDAR devices, which will be described later, often include a light source emitting light with a wavelength of around 900 nm. In this wavelength band, the light absorption efficiency of the photo-sensing element 90 according to Comparative Example is very low. In contrast, the degree of drop in light absorption efficiency in the photo-sensing element including a porous silicon layer is lower than that of the photo-sensing element according to Comparative Example.

As described above, the existence of the porous silicon layer 12 under the n-type semiconductor layer 13 in the first embodiment allows light having an arbitrary wavelength, which is not absorbed by the depletion layer having a limited thickness and is scattered or diffused, to return to the depletion layer due to the light confinement effect of the porous silicon layer 12. Therefore, the effective optical path length may be elongated to increase the light absorption efficiency. Furthermore, the process reproducibility of such a device is high, and the sensitivity to light in the near-infrared wavelength band may be considerably improved by an improvement in light absorption rate and an increase in aperture ratio.

Optical characteristics of the first embodiment for light having a wavelength of around 900 nm, which is mainly used in LIDAR devices, have been described. The effect of the photo-sensing element including a porous silicon layer according to the first embodiment is also obtained for light having a wavelength of around 600 nm. Therefore, the embodiment may be used in a measurement apparatus including, for example, infrared laser devices and LEDs.

As described above, the photodetector according to the first embodiment has a high sensitivity in detecting light in a near-infrared wavelength band.

Second Embodiment

Figure 11:
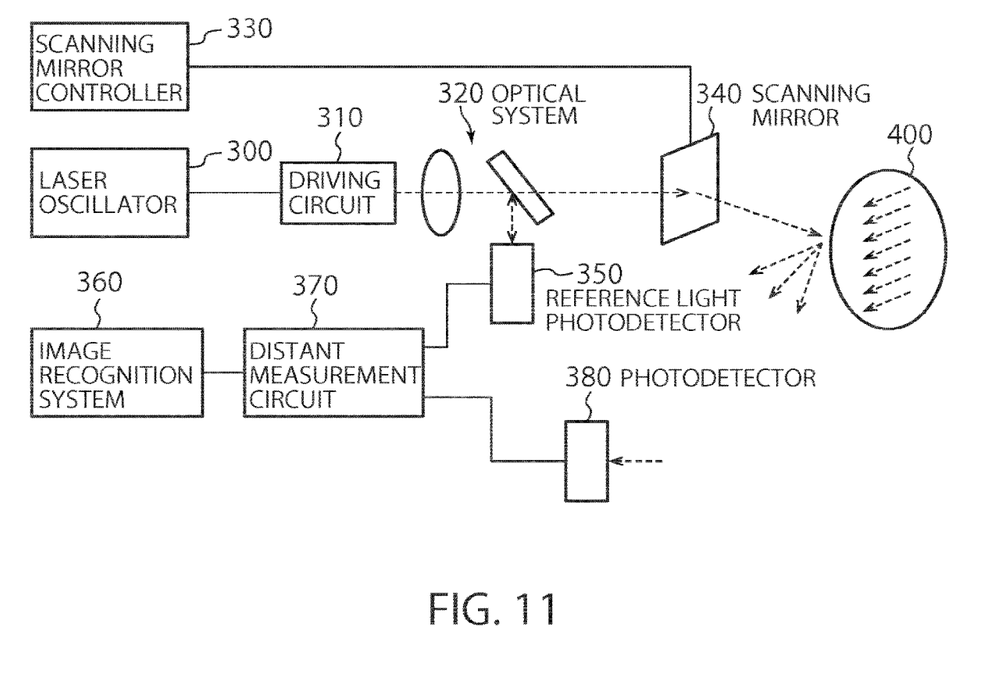
FIG. 11 is a block diagram showing a LIDAR device according to a second embodiment.

FIG. 11 shows a laser imaging detection and ranging (LIDAR) device according to a second embodiment. The LIDAR device according to the second embodiment is a range image sensing system in which a time of flight distance measurement is used for measuring a period of time during which a laser beam goes to and back from a target, and converting the period of time to a distance. The LIDAR device may be applied to a vehicle-mounted drive assistance system, a remote sensing system, and so on.

As shown in FIG. 11, the LIDAR device according to the third embodiment includes a light-emitting unit and a light-receiving unit. The light-emitting unit includes a laser oscillator 300 configured to emit laser beams, a driving circuit 310 configured to activate the laser beams, an optical system 320 configured to take out a part of the activated laser beams as a reference light and emitting the remaining laser beams to an object 400 via a scanning mirror 340, and a scanning mirror controller 330 configured to control the scanning mirror 340 to direct the laser beams to the object 400.

The light-receiving unit includes a reference light photodetector 350 configured to detect the reference light taken out by the optical system 320, a photodetector 380 configured to receive reflection light form the object 400, a distance measurement circuit (also referred to as "time of flight (TOF) circuit") 370 configured to perform distance measurement with respect to the object 400 based on the reference light detected by the reference light photodetector 350 and the reflection light detected by the photodetector 380, and an image recognition system 360 configured to recognize the object as an image based on a result of the distance measurement performed by the distance measurement circuit 370. In the second embodiment, the photodetector 1 according to the first embodiment works as the reference light photodetector 350 and the photodetector 380.

The photodetector 1 according to the first embodiment has a good sensitivity to light in a near-infrared region. Therefore, the LIDAR device according to the second embodiment is capable of being applied to a light source for emitting light in a wavelength band that is invisible to human beings, and may be used in an obstacle detection system for a motor vehicle. Furthermore, a LIDAR device including a photodetector with a high sensitivity to light in a near-infrared wavelength band may be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetector comprising:
   a first semiconductor layer;
   a porous semiconductor layer disposed on the first semiconductor layer; and
   at least one photo-sensing element including a second semiconductor layer of a first conductivity type disposed in a region of the porous semiconductor layer and a third semiconductor layer of a second conductivity type disposed on the second semiconductor layer.

2. The photodetector according to claim 1, wherein the photo-sensing element further includes a fourth semiconductor layer of the second conductivity type disposed on a part of the second semiconductor layer, and a fifth semiconductor layer of the second conductivity type disposed on the third semiconductor layer, an impurity concentration of the fourth semiconductor layer and an impurity concentration of the fifth semiconductor layer being higher than an impurity concentration of the third semiconductor layer.

3. The photodetector according to claim 1, wherein the photo-sensing element includes an avalanche photodiode.

4. The photodetector according to claim 1, wherein the porous semiconductor layer includes a base material and a hole disposed in the base material, the hole being formed of air or a material having a lower refractive index than the base material.

5. The photodetector according to claim 4, wherein a diameter of the hole is in a range from 0.01 µm to 1 µm.

6. The photodetector according to claim 4, wherein a diameter of the hole is in a range from 0.1 µm to 0.2 µm.

7. The photodetector according to claim 1, wherein the porous semiconductor layer has a thickness in a range from 3 µm to 10 µm.

8. A LIDAR device comprising:
   a laser oscillator configured to emit laser beams;
   a scanning mirror;
   an optical system configured to take out a part of the laser beams activated by the driving circuit as a reference light and to emit remaining laser beams to an object via the scanning mirror;
   a controller configured to control the scanning mirror to direct the remaining laser beams to the object;
   a first photodetector configured to detect the reference light taken out by the optical system;
   a second photodetector configured to receive reflection light from the object, the second photodetector comprising: a first semiconductor layer; a porous semiconductor layer disposed on the first semiconductor layer; and at least one photo-sensing element including a second semiconductor layer of a first conductivity type disposed in a region of the porous semiconductor layer and a third semiconductor layer of a second conductivity type disposed on the second semiconductor layer; and
   a distance measurement circuit configured to perform distance measurement with respect to the object based on the reference light detected by the first photodetector and the reflection light detected by the second photodetector.

9. The LIDAR device according to claim 8, further comprising an image recognition system configured to recognize the object as an image based on a result of the distance measurement performed by the distance measurement circuit.

10. The LIDAR device according to claim 8, wherein the photo-sensing element further includes a fourth semiconductor layer of the second conductivity type disposed on a part of the second semiconductor layer, and a fifth semiconductor layer of the second conductivity type disposed on the third semiconductor layer, an impurity concentration of the fourth semiconductor layer and an impurity concentration of the fifth semiconductor layer being higher than an impurity concentration of the third semiconductor layer.

11. The LIDAR device according to claim 8, wherein the photo-sensing element includes an avalanche photodiode.

12. The LIDAR device according to claim 8, wherein the porous semiconductor layer includes a base material and a hole disposed in the base material, the hole being formed of air or a material having a lower refractive index than the base material.

13. The LIDAR device according to claim 12, wherein a diameter of the hole is in a range from 0.01 µm to 1 µm.

14. The LIDAR device according to claim 12, wherein a diameter of the hole is in a range from 0.1 μm to 0.2 μm.

15. The LIDAR device according to claim 8, wherein the porous semiconductor layer has a thickness in a range from 3 μm to 10 μm.

\* \* \* \* \*